(12) United States Patent
Shizuki

(10) Patent No.: US 6,801,071 B1
(45) Date of Patent: Oct. 5, 2004

(54) SEMICONDUCTOR INTEGRATED CIRCUIT DEVICE WITH DIFFERENTIAL OUTPUT DRIVER CIRCUIT, AND SYSTEM FOR SEMICONDUCTOR INTEGRATED CIRCUIT DEVICE

(75) Inventor: Yasushi Shizuki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/620,382

(22) Filed: Jul. 17, 2003

(30) Foreign Application Priority Data

Apr. 25, 2003 (JP) ........................................ 2003-121631

(51) Int. Cl.$^7$ ...................... H03K 17/16; H03K 19/003
(52) U.S. Cl. ................................ 327/264; 326/30
(58) Field of Search .......................... 327/108, 261–264, 327/266, 271–272, 274, 285, 287; 326/30, 82, 86

(56) References Cited

U.S. PATENT DOCUMENTS

| | | | | |
|---|---|---|---|---|
| 5,111,080 A | * | 5/1992 | Mizukami et al. | ............ 326/30 |
| 5,457,406 A | * | 10/1995 | Takada et al. | ................ 326/30 |
| 5,886,554 A | | 3/1999 | Corsi et al. | .................. 327/170 |
| 6,373,275 B1 | * | 4/2002 | Otsuka et al. | ................ 326/30 |
| 6,696,852 B1 | * | 2/2004 | Brunolli | ...................... 326/30 |
| 6,697,286 B2 | * | 2/2004 | Nakagawa | ............. 365/189.05 |

FOREIGN PATENT DOCUMENTS

JP 3144199 1/2001

* cited by examiner

Primary Examiner—My-Trang Nuton
(74) Attorney, Agent, or Firm—Oblon, Spivak, McClelland, Maier & Neustadt, P.C.

(57) ABSTRACT

A semiconductor integrated circuit device includes a differential output driver circuit arranged at each I/O portion, and a delay element. The differential output driver circuit receives a pair of differential signals generated by a circuit on the input stage. An output signal from the differential output driver circuit is transmitted through the first and second signal lines. Each of the first and second signal lines includes a global interconnection, bump, and transmission line. The delay element is inserted in at least one of the first and second signal lines. The delay element delays signals passing through the signal lines so as to make the delays of the signals substantially equal to each other, compensating for the signal delay time generated by the line length difference.

6 Claims, 9 Drawing Sheets

SEMICONDUCTOR INTEGRATED CIRCUIT DEVICE WITH DIFFERENTIAL OUTPUT DRIVER CIRCUIT, AND SYSTEM FOR SEMICONDUCTOR INTEGRATED CIRCUIT DEVICE

CROSS-REFERENCE TO RELATED APPLICATIONS

This application is based upon and claims the benefit of priority from the prior Japanese Patent Application No. 2003-121631, filed Apr. 25, 2003, the entire contents of which are incorporated herein by reference.

BACKGROUND OF THE INVENTION

1. Field of the Invention

The present invention relates to a semiconductor integrated circuit device and a system using the semiconductor integrated circuit device and, more particularly, is applied to a high-speed input/output circuit which transmits a pair of differential signals.

2. Description of the Related Art

Recently, the speed of an input/output circuit (to be simply referred to as an I/O circuit) increases, and a semiconductor integrated circuit device must process an input/output signal in the GHz band. To process a signal of such high frequency by the I/O circuit, for example, a pair of differential signals resistant to noise are used for the input and output. Alternatively, bump connection capable of implementing a short, uniform wiring length is used for connection between an LSI and a package.

Figure 1:
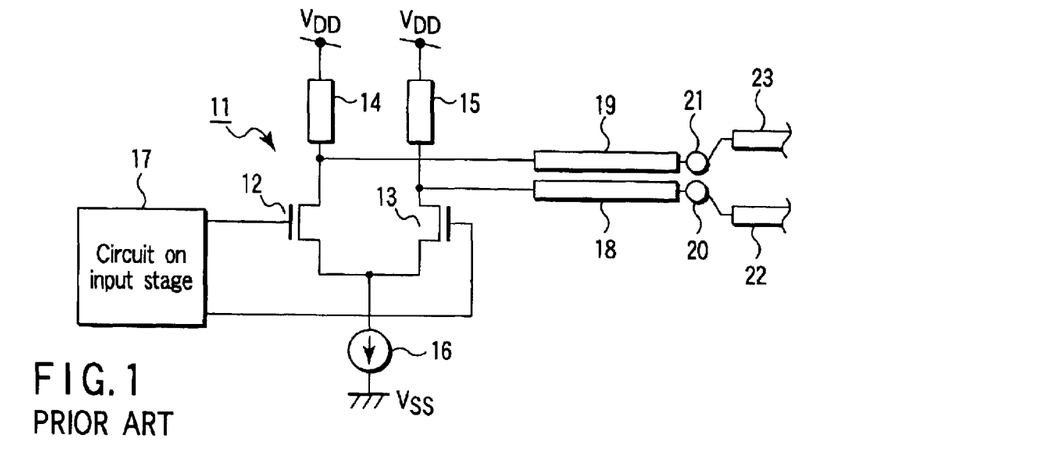
FIG. 1 is a circuit diagram showing an output circuit which transmits a pair of differential signals, in order to explain a conventional semiconductor integrated circuit device.

FIG. 1 shows an output circuit (differential output driver circuit) which transmits a pair of differential signals, in order to explain a conventional semiconductor integrated circuit device. A differential output driver circuit 11 comprises differential input MOSFETs (Metal-Oxide-Semiconductor Field-Effect Transistors) 12 and 13, load elements 14 and 15, and a constant-current source 16. The gates of the differential input MOSFETs 12 and 13 receive a pair of differential signals from a circuit 17 on the input stage. The load elements 14 and 15 are respectively connected between the drains of the differential input MOSFETs 12 and 13 and a power supply $V_{DD}$. The sources of the differential input MOSFETs 12 and 13 are commonly connected, and the constant-current source 16 is connected between the common source node and ground $V_{SS}$.

One end of a global interconnection 18 is connected to the node between the drain of the MOSFET 13 and the load element 15, and the other end is connected to a bump 20. One end of a global interconnection 19 is connected to the node between the drain of the MOSFET 12 and the load element 14, and the other end is connected to a bump 21. The bumps 20 and 21 function as IC or LSI output terminals and are formed on a chip surface. Each of the bumps 20 and 21 is connected to one end of a corresponding one of transmission lines 22 and 23 formed within a package (bonding wires, lead frame, TAB tape, or the like) or on a printed circuit board on which the semiconductor integrated circuit device is mounted.

In a system LSI, many differential output driver circuits 11 are arranged at I/O portions. The transmission lines 22 and 23 are terminated by the same resistances as the characteristic impedances of the transmission lines 22 and 23 on the receiving side, which is not shown in FIG. 1.

If the differential output driver circuit 11 operates ideally, the circuit 11 is resistant to external noise. However, the following problems occur because of the presence of many I/O circuits within the chip.

(a) If the signal line lengths of a pair of differential signals are not equal to each other, a skew in propagation delay time occurs at the ends of the transmission lines 22 and 23.

(b) The skew generates an in-phase current between the transmission lines 22 and 23 (ideally no in-phase current is generated), generating noise (common mode noise) which is radiated upon coupling with a neighboring pattern.

Examples of the line length difference which causes problems (a) and (b) are as follows.

(1) The wiring length difference between the transmission lines 22 and 23 formed within a package (bonding wire, lead frame, or TAB tape) or on a printed circuit board.

(2) The wiring length difference between the global interconnections 18 and 19 which respectively connect the load elements 14 and 15 and the bumps 20 and 21.

As for difference (1), the wiring lengths are often adjusted by bending one wire into a U shape on the printed circuit board so as to make the wiring lengths equal to each other. If the frequency of a pair of differential signals increases to the GHz band, the U-shaped wire undesirably radiates electromagnetic waves. As the number of I/O portions increases, many U-shaped wires must be arranged on the printed circuit board, increasing the transmission line layout area.

As for difference (2), the wiring lengths are adjusted on the LSI similarly to difference (1). Adjustment of the lengths of a pair of differential lines on the LSI for all I/O portions wastes the space. The return current from ground suffers a path difference depending on the positional relationship between a bump serving as a ground terminal and the signal input/output bumps 20 and 21. A skew equal to or larger than the line length difference between the global interconnections 18 and 19 may occur. At a GHz-band frequency, the wiring length difference between the global interconnections 18 and 19 may generate a skew or common mode noise.

As described above, to reduce a skew or common mode noise, the line lengths of a pair of the differential lines must be kept as equal to each other as possible. In practice, the line length difference between a pair of differential lines cannot be eliminated owing to variations caused by the manufacturing tolerance of the package or printed circuit board.

Especially when a pair of differential signals have a GHz-band frequency, such variations greatly influence the transmission characteristic. In mass production, a system having a function of checking a margin for manufacturing variations is required.

For example, Japanese Patent No. 3,144,199 discloses a skew correction circuit using a differential amplifier and resistor. If the skew correction circuit is arranged at each I/O portion, the area occupied on the chip greatly increases due to a large circuit scale. Application of the skew correction circuit to a semiconductor integrated circuit device which processes a signal of a high GHz-band frequency is not practical.

In this manner, the conventional semiconductor integrated circuit device generates a skew or common mode noise by the line length difference between a pair of differential lines.

In mass production, a system using a semiconductor integrated circuit device capable of checking a margin for manufacturing variations is required.

BRIEF SUMMARY OF THE INVENTION

According to one aspect of the present invention, there is provided a semiconductor integrated circuit device comprising a chip on which an integrated circuit is formed, a differential output driver circuit which externally outputs a pair of differential signals generated by the integrated circuit, first and second signal lines which transmit the pair of differential signals output from the differential output driver circuit, and a delay unit which is connected in the chip to at least one of the first and second signal lines, has an active element for delaying signals passing through the first and second signal lines so as to make delays of the signals substantially equal to each other, and compensates for a signal delay time generated by a line length difference between the first and second signal lines.

According to another aspect of the present invention, there is provided a semiconductor integrated circuit device comprising a chip on which an integrated circuit is formed, a differential output driver circuit which externally outputs a pair of differential signals generated by the integrated circuit, first and second signal lines which transmit the pair of differential signals output from the differential output driver circuit, and a delay unit which is connected in the chip to at least one of third and fourth signal lines which transmit the pair of differential signals from the integrated circuit to the differential output driver circuit, has an active element for delaying at least one of the pair of differential signals so as to make delays of the signals passing through the first and second signal lines substantially equal to each other, and compensates for a signal delay time generated by a line length difference between the first and second signal lines.

According to still another aspect of the present invention, there is provided a system using a semiconductor integrated circuit device, comprising a semiconductor integrated circuit device comprising a differential output driver circuit which externally outputs via first and second signal lines a pair of differential signals generated within a chip, a first receiving unit which receives the pair of differential signals output from the semiconductor integrated circuit device via the first and second signal lines, a signal processing unit which processes the pair of differential signals received by the first receiving unit and generates correction data for correcting unbalance between the pair of differential signals, a transmitting unit which transmits the correction data generated by the signal processing unit to the semiconductor integrated circuit device, a second receiving unit which is arranged in the semiconductor integrated circuit device and receives the correction data transmitted from the transmitting unit, and a delay unit which changes a delay time on the basis of the correction data received by the second receiving unit, has an active element for delaying signals passing through the first and second signal lines so as to make delays of the signals substantially equal to each other, and compensates for a signal delay time generated by a line length difference between the first and second signal lines.

DETAILED DESCRIPTION OF THE INVENTION

First Embodiment

Figure 2:
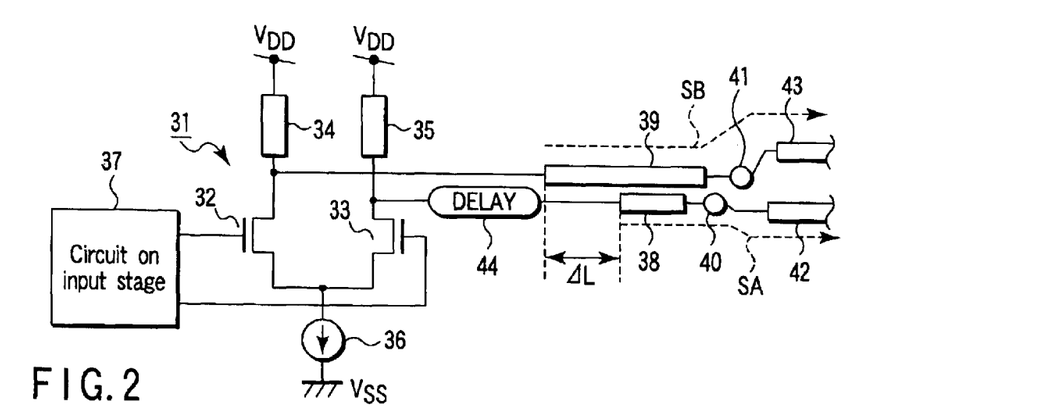
FIG. 2 is a circuit diagram showing an output circuit which transmits a pair of differential signals, in order to explain a semiconductor integrated circuit device according to the first embodiment of the present invention.

FIG. 2 shows an output circuit (differential output driver circuit) which transmits a pair of differential signals, in order to explain a semiconductor integrated circuit device according to the first embodiment of the present invention. Similar to the circuit shown in FIG. 1, a differential output driver circuit 31 comprises differential input MOSFETs 32 and 33, load elements 34 and 35 such as resistors, and a constant-current source 36. The gates of the differential input MOSFETs 32 and 33 receive a pair of differential signals from a circuit (integrated circuit) 37 on the input stage. The load elements 34 and 35 are respectively connected between the drains of the differential input MOSFETs 32 and 33 and a power supply $V_{DD}$. The sources of the differential input MOSFETs 32 and 33 are commonly connected, and the constant-current source 36 is connected between the common source node and ground $V_{SS}$.

One end of a global interconnection 38 is connected via a delay element (DELAY) 44 to the node between the drain of the MOSFET 33 and the load element 35, and the other end is connected to a bump 40. One end of a global interconnection 39 is connected to the node between the drain of the MOSFET 32 and the load element 34, and the other end is connected to a bump 41.

The bumps 40 and 41 function as IC or LSI output terminals and are formed on a chip surface. Each of the bumps 40 and 41 is connected to one end of a corresponding one of transmission lines 42 and 43 formed within a package (bonding wires, lead frame, TAB tape, or the like) or on a printed circuit board on which the semiconductor integrated circuit device is mounted.

The delay element 44 adjusts the signal delay time generated by the line length difference between a pair of differential lines to be substantially equal to each other. For example, when a signal line (indicated by a broken arrow SA) formed by the global interconnection 38, bump 40, and transmission line 42 is shorter by ΔL than a signal line (indicated by a broken arrow SB) formed by the global interconnection 39, bump 41, and transmission line 43, the delay element 44 delays a signal on the signal line SA so as to make the delays of signals on the signal lines SA and SB substantially equal to each other. The signal delay amount by the delay element 44 may be fixed or changed.

In a system LSI, many differential output driver circuits 31 are arranged at I/O portions. The transmission lines 42 and 43 are terminated by the same resistances as the characteristic impedances of the transmission lines 42 and 43 on the receiving side, which is not shown in FIG. 2.

In this arrangement, the delay element 44 can compensate for the signal delay time generated by the line length difference between a pair of differential lines, reducing a skew and common mode noise.

EXAMPLE 1

Figure 3:
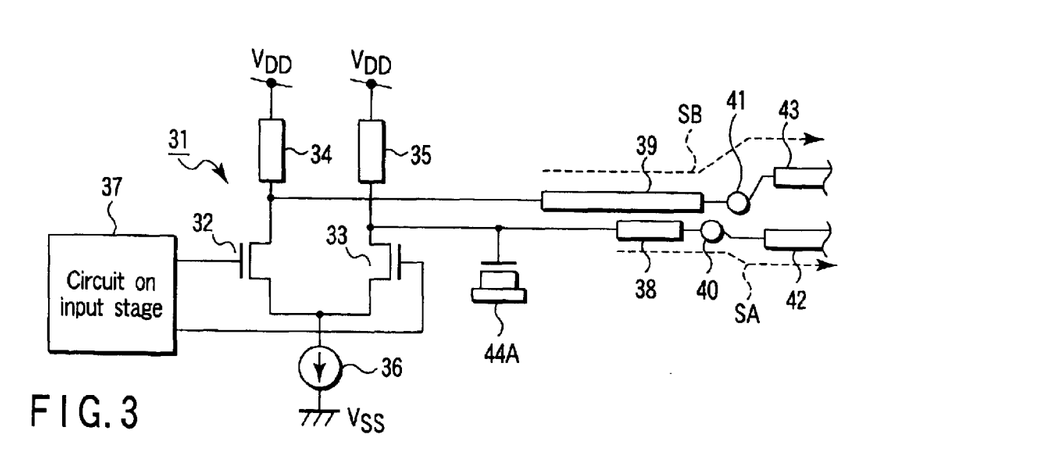
FIG. 3 is a circuit diagram showing a concrete implementation example (Example 1) of a delay element in the semiconductor integrated circuit device according to the first embodiment.

FIG. 3 shows a concrete implementation example of the delay element 44 in the semiconductor integrated circuit device according to the first embodiment. In FIG. 3, the same reference numerals as in FIG. 2 denote the same parts, and a detailed description thereof will be omitted.

In this example, a capacitance element 44A formed from the gate capacitance of an active element is arranged as the delay element 44 shown in FIG. 2.

For example, in a MOS capacitor, a very thin oxide film serves as a capacitor dielectric, and the line length difference (delay time difference) between a pair of differential lines (signal lines SA and SB) can be compensated for by a very small pattern occupation area. The MOS capacitor can be formed simultaneously in the step of forming the differential input MOSFETs 32 and 33. No new manufacturing step need be added for forming the delay element 44.

In this arrangement, the capacitance element 44A can compensate for the signal delay time generated by the line length difference between a pair of differential lines, reducing a skew and common mode noise.

EXAMPLE 2

Figure 4:
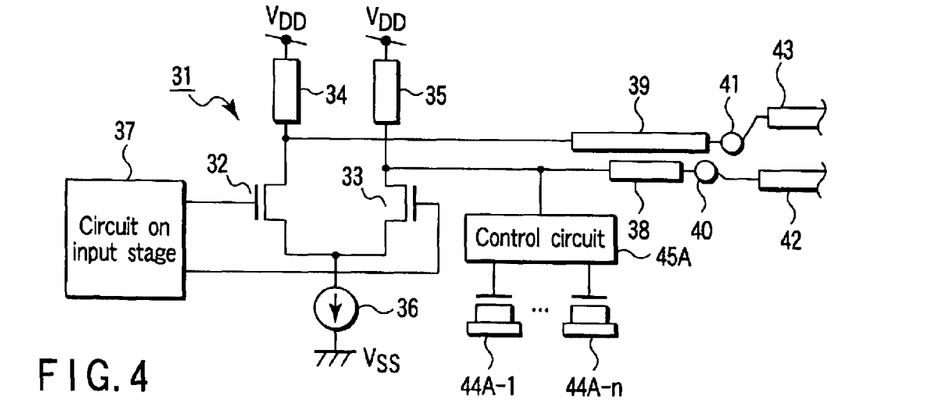
FIG. 4 is a circuit diagram showing another concrete implementation example (Example 2) of the delay element in the semiconductor integrated circuit device according to the first embodiment.

FIG. 4 shows another concrete implementation example of the delay element 44 in the semiconductor integrated circuit device according to the first embodiment. In FIG. 4, the same reference numerals as in FIG. 2 denote the same parts, and a detailed description thereof will be omitted.

In this example, a control circuit 45A and a plurality of (n) capacitance elements (e.g., MOS capacitors) 44A-1, ..., 44A-n each formed from the gate capacitance of an active element are arranged as the delay element 44 shown in FIG. 2. The control circuit 45A is interposed between one electrode of each of the capacitance elements 44A-1, ..., 44A-n and one end of the global interconnection 38. The control circuit 45A controls a potential applied to one electrode of each of the capacitance elements 44A-1, ..., 44A-n, selectively changing the thickness of the depletion layer of each capacitance element. The capacitance connected to one end of the global interconnection 38 can be changed to freely set the signal delay amount.

This arrangement can finely control the signal delay amount by using the control circuit 45A, in addition to the effects of Example 1.

The signal delay time by the line length difference between a pair of differential lines can be more accurately compensated for, and a skew and common mode noise can be further reduced.

The capacitance ratio of the n capacitance elements 44A-1, ..., 44A-n is set to 1:2:4: ... :$2^n$ so as to change the delay amount at a $2^n$-power step. By selecting the capacitance elements 44A-1, ..., 44A-n, the delay amount can be set at a fine step within a wide range of a large capacity to a small capacity, and can be more accurately controlled.

EXAMPLE 3

Figure 5:
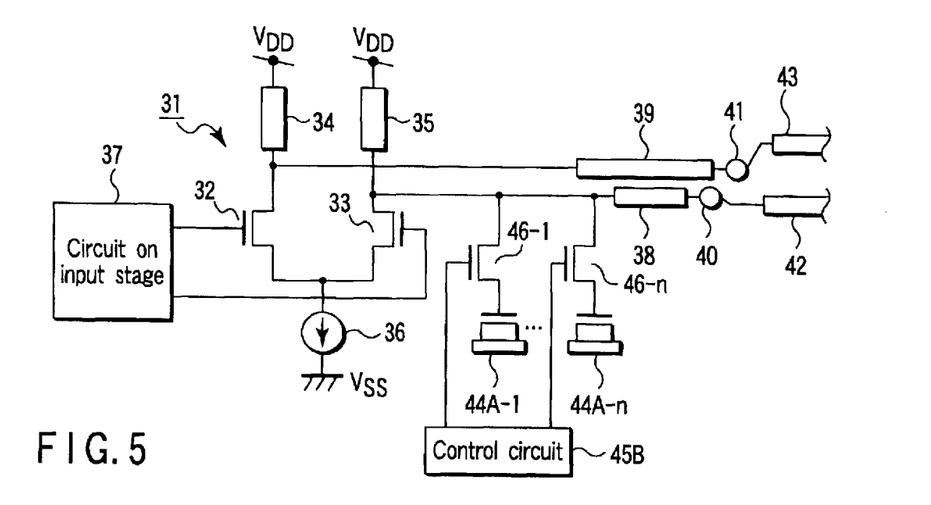
FIG. 5 is a circuit diagram showing still another concrete implementation example (Example 3) of the delay element in the semiconductor integrated circuit device according to the first embodiment.

FIG. 5 shows still another concrete implementation example of the delay element 44 in the semiconductor integrated circuit device according to the first embodiment. In FIG. 5, the same reference numerals as in FIG. 2 denote the same parts, and a detailed description thereof will be omitted.

In this example, the current path of each of switching elements (MOSFETs) 46-1, ..., 46-n is connected between one electrode (gate electrode) of a corresponding one of capacitance elements 44A-1, ..., 44A-n and one end of the global interconnection 38. A control circuit 45B selectively applies a high-level ("H"-level) or low-level ("L"-level) potential to the gates of the MOSFETs 46-1, ..., 46-n, and controls their ON/OFF operation.

Which gate capacitance (capacitance element 44A-1, ..., 44A-n) is to be connected to the global interconnection 38 can be selected, and the signal delay amount can be freely controlled.

The capacitance ratio of the n capacitance elements 44A-1, ..., 44A-n is set to 1:2:4: ... :$2^n$ so as to change the delay amount at a $2^n$-power step. By selecting the capacitance elements 44A-1, ..., 44A-n, the delay amount can be set at a fine step within a wide range of a large capacity to a small capacity, and can be more accurately controlled.

The signal delay time by the line length difference between a pair of differential lines can be more accurately compensated for, and a skew and common mode noise can be further reduced.

EXAMPLE 4

Figure 6:
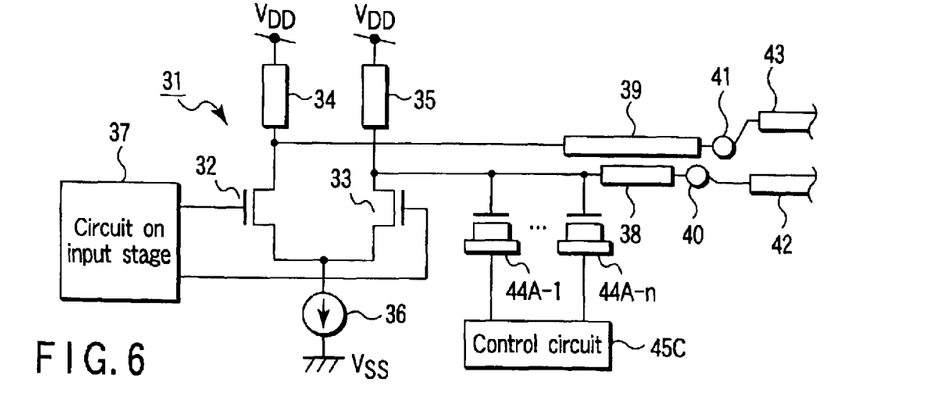
FIG. 6 is a circuit diagram showing still another concrete implementation example (Example 4) of a delay element in the semiconductor integrated circuit device according to the first embodiment.

FIG. 6 shows still another concrete implementation example of the delay element 44 in the semiconductor integrated circuit device according to the first embodiment. In FIG. 6, the same reference numerals as in FIG. 2 denote the same parts, and a detailed description thereof will be omitted.

In this example, one electrode (gate electrode) of each of capacitance elements 44A-1, . . . , 44-$n$ is connected to one end of the global interconnection 38. A control circuit 45C selectively applies an "H"- or "L"-level potential to the other electrode (layer which forms a counter electrode with respect to the gate electrode) of each of the capacitance elements 44A-1, . . . , 44A-n.

The capacitances of the capacitance elements 44A-1, . . . , 44A-n connected to one end of the global interconnection 38 can be selected, freely controlling the signal delay amount.

In Example 4, similar to Examples 2 and 3, the capacitance ratio of the n capacitance elements is set to 1:2:4: . . . :$2^n$ so as to change the delay amount at a $2^n$-power step. By selecting the capacitance elements 44A-1, . . . , 44A-n, the delay amount can be set at a fine step within a wide range of a large capacity to a small capacity, and can be more accurately controlled.

The signal delay time by the line length difference between a pair of differential lines can be more accurately compensated for, and a skew and common mode noise can be further reduced.

In the first embodiment and Examples 1 to 4, the delay element 44 is connected to only one having a shorter line length out of a pair of global interconnections 39 and 38. It is also possible to arrange the delay elements 44 on both the global interconnections 38 and 39 and adjust signal delay times generated by the line length difference between a pair of differential lines so as to be substantially equal to each other.

A plurality of delay elements having different structures may be combined and connected to at least one of a pair of global interconnections 38 and 39.

Second Embodiment

Figure 7:
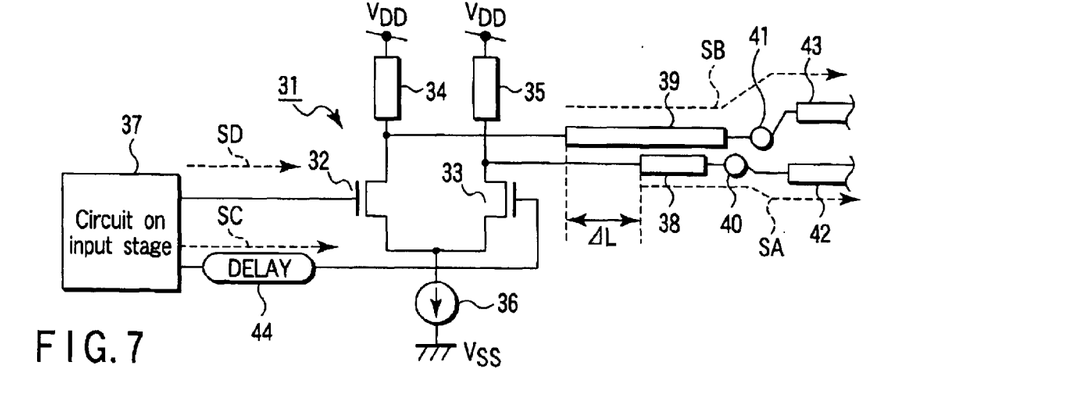
FIG. 7 is a circuit diagram showing an output circuit which transmits a pair of differential signals, in order to explain a semiconductor integrated circuit device according to the first embodiment of the present invention.

FIG. 7 shows an output circuit (differential output driver circuit) which transmits a pair of differential signals, in order to explain a semiconductor integrated circuit device according to the second embodiment of the present invention. Similar to the circuit shown in FIG. 2, a differential output driver circuit 31 comprises differential input MOSFETs 32 and 33, load elements 34 and 35, and a constant-current source 36. The gate of the differential input MOSFET 33 receives one of a pair of differential signals via a delay element (DELAY) 44 from a circuit (integrated circuit) 37 on the input stage. The gate of the differential input MOSFET 32 receives the other differential signal from the circuit 37.

The load elements 34 and 35 such as resistors are respectively connected between the drains of the differential input MOSFETs 32 and 33 and a power supply $V_{DD}$. The sources of the differential input MOSFETs 32 and 33 are commonly connected, and the constant-current source 36 is connected between the common source node and ground $V_{SS}$.

One end of a global interconnection 38 is connected to the node between the drain of the MOSFET 33 and the load element 35, and the other end is connected to a bump 40. One end of a global interconnection 39 is connected to the node between the drain of the MOSFET 32 and the load element 34, and the other end is connected to a bump 41.

The bumps 40 and 41 function as IC or LSI output terminals and are formed on a chip surface. Each of the bumps 40 and 41 is connected to one end of a corresponding one of transmission lines 42 and 43 formed within a package or on a printed circuit board on which the semiconductor integrated circuit device is mounted.

The delay element 44 adjusts the signal delay time generated by the line length difference between a pair of differential lines to be substantially equal to each other. For example, when a signal line (indicated by a broken arrow SA) formed by the global interconnection 38, bump 40, and transmission line 42 is shorter by ΔL than a signal line (indicated by a broken arrow SB) formed by the global interconnection 39, bump 41, and transmission line 43, the delay element 44 delays one of a pair of differential signals that is supplied from the circuit 37 to the gate of the MOSFET 33 via a signal line (indicated by a broken arrow SC). Accordingly, a signal on the signal line SA corresponding to the signal line SC is delayed, and the delays of signals on the signal lines SA and SB are adjusted to be substantially equal to each other. The signal delay amount by the delay element 44 may be fixed or changed.

In a system LSI, many differential output driver circuits 31 are arranged at I/O portions. The transmission lines 42 and 43 are terminated by the same resistances as the characteristic impedances of the transmission lines 42 and 43 on the receiving side, which is not shown in FIG. 7.

In this embodiment, the delay element 44 is inserted into the signal line SC on the input side of the differential output driver circuit 31. The delay element 44 may be inserted in a signal line which transmits an arbitrary pair of differential signals in the circuit 37.

In this arrangement, the delay element 44 can delay one of a pair of differential signals input to the gates of the differential input MOSFETs 32 and 33, and compensate for the signal delay time generated by the line length difference between a pair of differential lines SA and SB, reducing a skew and common mode noise.

Figure 8A:
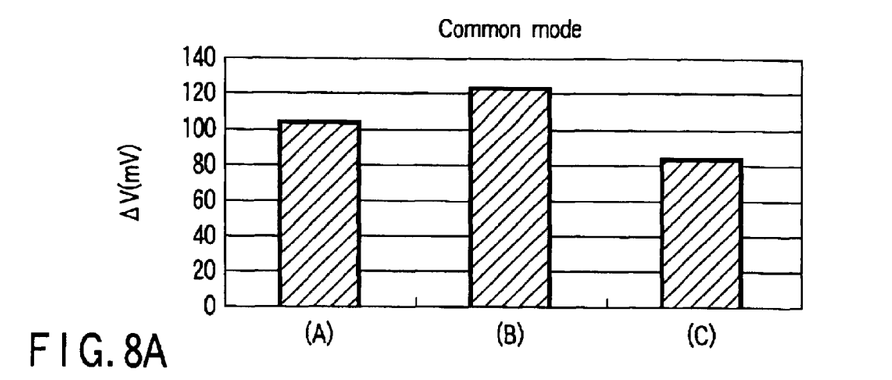
FIG. 8A is a diagram showing the peak-to-peak value of the waveforms of a pair of differential signals in a common mode as the results of simulating the effect of inserting a delay element on the input stage of a differential line.
Figure 8B:
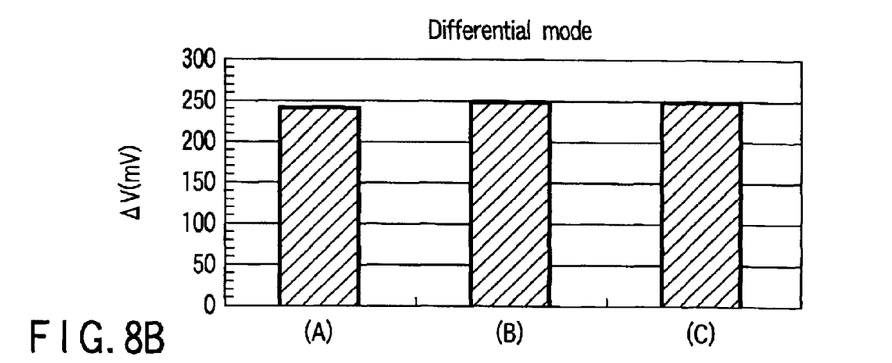
FIG. 8B is a diagram showing the maximum value of the waveforms of a pair of differential signals in a differential mode as the results of simulating the effect of inserting the delay element on the input stage of the differential line.
Figure 8C:
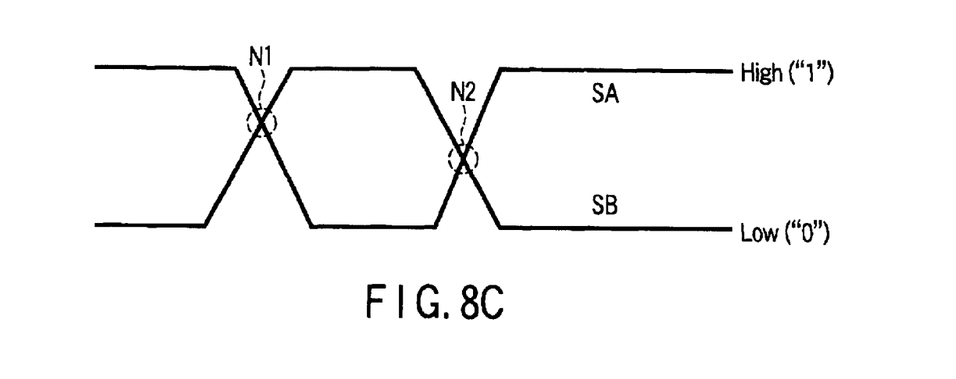
FIG. 8C is a waveform chart showing transition a pair of differential signals.

FIGS. 8A and 8B show simulation results when the delay element 44 is inserted on the input stage of the differential output driver circuit 31. The frequency of a pair of differential signals is 4.0 GHz, the electrical lengths (wiring lengths) of the signal lines SA and SB for a pair of differential signals are 298 mm and 302 mm, respectively, and the input and output are terminated at 50 Ω. FIG. 8A shows, as the simulation results of common mode noise, the peak-to-peak value of the common mode component of a pair of differential signals (added waveform of a pair of differential signals). FIG. 8B shows, as the simulation results of a differential mode, the maximum value of the waveforms of a pair of differential signals. FIG. 8C shows transition of the waveforms of a pair of differential signals. When signals which propagate through the signal lines SA and SB for a pair of differential signals are " . . . 010 . . . " and " . . . 101 . . . ", a peak-to-peak value ΔV in the common mode in FIG. 8A represents the absolute value of the difference between common mode components at intersections N1 and N2 in transition of a pair of differential signals, as shown in FIG. 8C. The peak-to-peak value ΔV increases depending on the electrical length difference between the signal lines SA and SB.

In FIGS. 8A and 8B, (A) shows a value in the second embodiment of the present invention (the delay element 44 having a delay element of 60 psec is arranged). (B) shows a value in the prior art using no delay element, and (C) shows a value when both the signal lines SA and SB for a pair of differential signals have the same electrical length of 300 mm. As is apparent from FIG. 8B, the signal component is smaller by 2.4% in (A) than those in (B) and (C). However, the common mode component in (A) is smaller by 15% than that in (B), as shown in FIG. 8A, and comes close to an ideal value in (C), realizing reduction in common mode noise.

EXAMPLE 5

Figure 9:
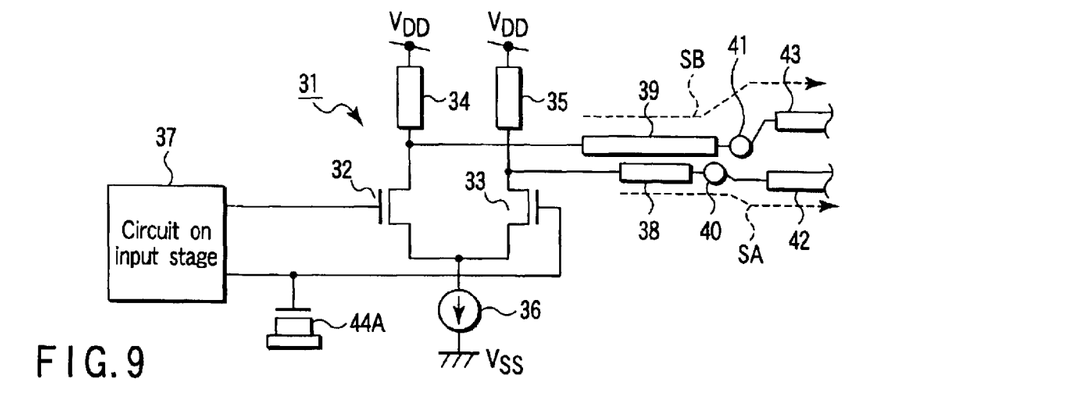
FIG. 9 is a circuit diagram showing a concrete implementation example (Example 5) of a delay element in the semiconductor integrated circuit device according to the second embodiment of the present invention.

FIG. 9 shows a concrete implementation example of the delay element 44 in the semiconductor integrated circuit device according to the second embodiment. In FIG. 9, the same reference numerals as in FIG. 7 denote the same parts, and a detailed description thereof will be omitted.

In this example, a capacitance element 44A formed from the gate capacitance of an active element is arranged as the delay element 44 shown in FIG. 7.

For example, in a MOS capacitor, a very thin oxide film serves as a capacitor dielectric, and the line length difference (delay time difference) between a pair of differential lines (signal lines SA and SB) can be compensated for by a very small pattern occupation area. The MOS capacitor can be formed simultaneously in the step of forming the differential input MOSFETs 32 and 33. No new manufacturing step need be added for forming the delay element 44.

In this arrangement, the delay of one of a pair of differential signals that is supplied to the MOSFET 33 can be increased to set a large signal delay amount of a shorter one (in this case, the signal line SA) of a pair of differential lines. The signal delay time by the line length difference between the signal lines SA and SB can be compensated for, reducing a skew and common mode noise.

EXAMPLE 6

Figure 10:
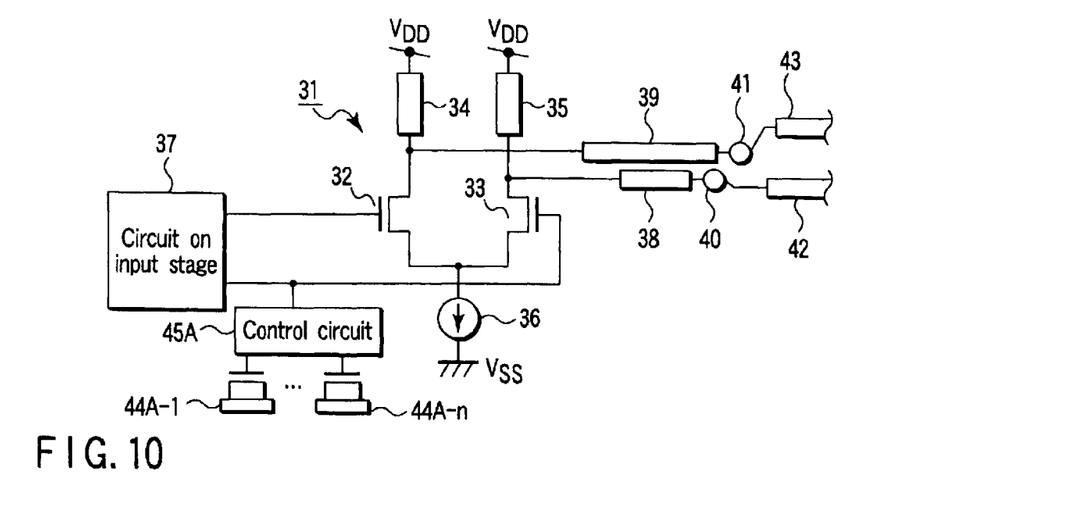
FIG. 10 is a circuit diagram showing another concrete implementation example (Example 6) of the delay element in the semiconductor integrated circuit device according to the second embodiment of the present invention.

FIG. 10 shows another concrete implementation example of the delay element 44 in the semiconductor integrated circuit device according to the second embodiment. In FIG. 10, the same reference numerals as in FIG. 7 denote the same parts, and a detailed description thereof will be omitted.

In this example, a control circuit 45A and a plurality of (n) capacitance elements (e.g., MOS capacitors) 44A-1, ..., 44A-n each formed from the gate capacitance of an active element are arranged as the delay element 44 shown in FIG. 7. The control circuit 45A is interposed between one electrode of each of the capacitance elements 44A-1, ..., 44A-n and the gate of the MOSFET 33. The control circuit 45A controls a potential applied to one electrode of each of the capacitance elements 44A-1, ..., 44A-n, selectively changing the thickness of the depletion layer of each capacitance element. The capacitance connected to the gate of the MOSFET 33 can be changed to freely set the signal delay amount.

This arrangement can finely control the signal delay amount by using the control circuit 45A, in addition to the effects of Example 5.

The signal delay time by the line length difference between a pair of differential lines can be more accurately compensated for, and a skew and common mode noise can be further reduced.

The capacitance ratio of the n capacitance elements 44A-1, ..., 44A-n is set to $1:2:4: \ldots :2^n$ so as to change the delay amount at a $2^n$-power step. By selecting the capacitance elements 44A-1, ..., 44A-n, the delay amount can be set at a fine step within a wide range of a large capacity to a small capacity, and can be more accurately controlled.

EXAMPLE 7

Figure 11:
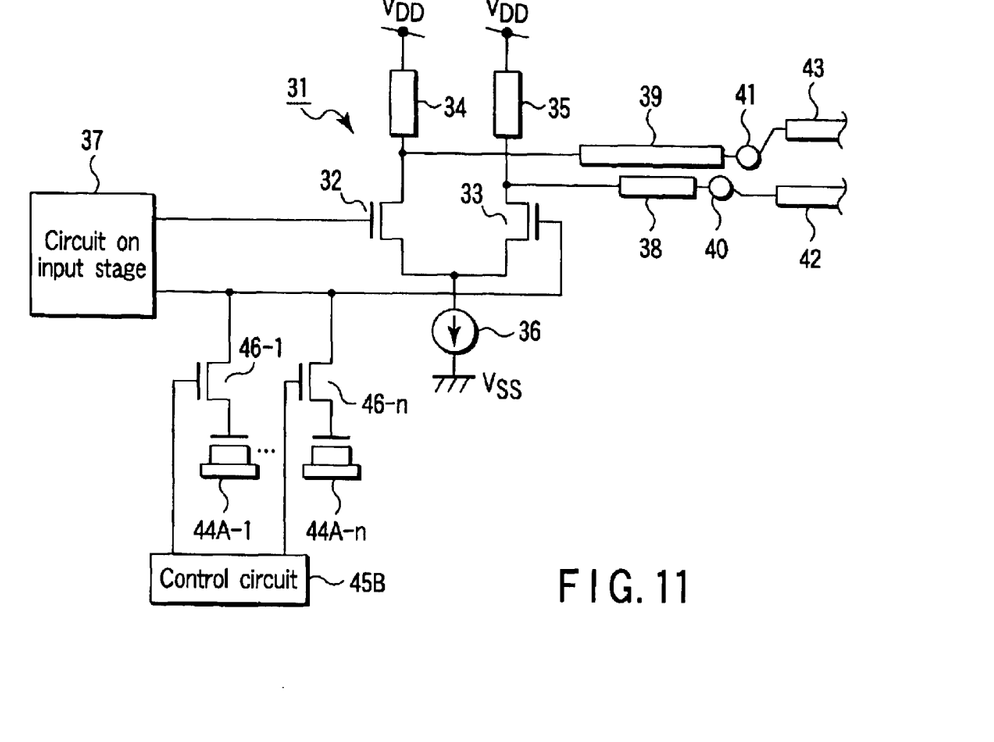
FIG. 11 is a circuit diagram showing still another concrete implementation example (Example 7) of the delay element in the semiconductor integrated circuit device according to the second embodiment of the present invention.

FIG. 11 shows still another concrete implementation example of the delay element 44 in the semiconductor integrated circuit device according to the second embodiment. In FIG. 11, the same reference numerals as in FIG. 7 denote the same parts, and a detailed description thereof will be omitted.

In this example, the current path of each of switching elements (MOSFETs) 46-1, ..., 46-n is connected between one electrode (gate electrode) of a corresponding one of capacitance elements 44A-1, ..., 44A-n and the gate of the MOSFET 33. A control circuit 45B selectively applies a high-level ("H"-level) or low-level ("L"-level) potential to the gates of the MOSFETs 46-1, ..., 46-n, and controls their ON/OFF operation.

Which gate capacitance (capacitance element 44A-1, ..., 44A-n) is to be connected to the MOSFET 33 can be selected, and the signal delay amount can be freely controlled.

The capacitance ratio of the n capacitance elements 44A-1, ..., 44A-n is set to $1:2:4: \ldots :2^n$ so as to change the delay amount at a $2^n$-power step. By selecting the capacitance elements 44A-1, ..., 44A-n, the delay amount can be set at a fine step within a wide range of a large capacity to a small capacity, and can be more accurately controlled.

The signal delay time by the line length difference between a pair of differential lines can be more accurately compensated for, and a skew and common mode noise can be further reduced.

EXAMPLE 8

Figure 12:
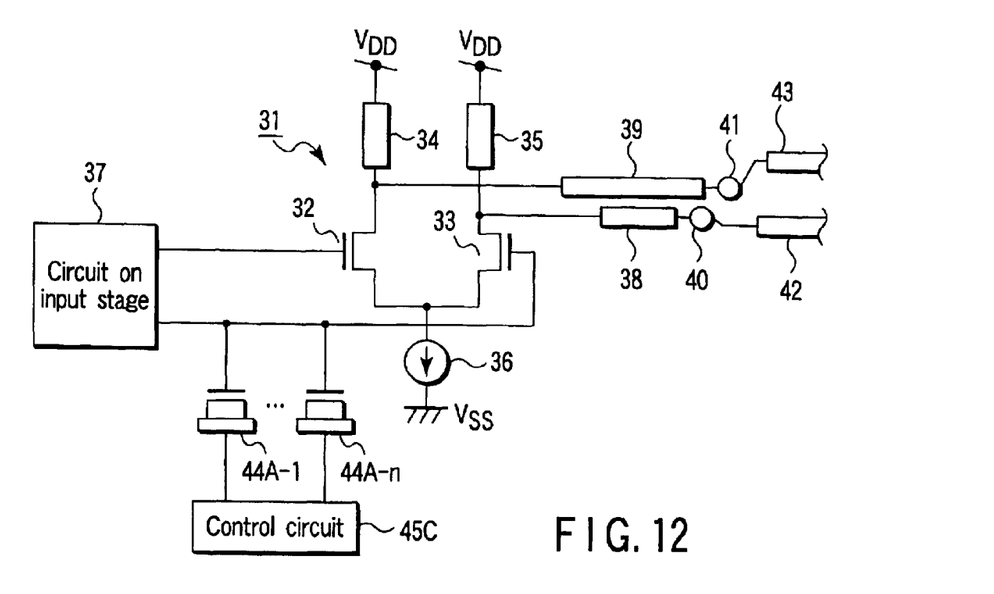
FIG. 12 is a circuit diagram showing still another concrete implementation example (Example 8) of the delay element in the semiconductor integrated circuit device according to the second embodiment of the present invention.

FIG. 12 shows still another concrete implementation example of the delay element 44 in the semiconductor integrated circuit device according to the second embodiment. In FIG. 12, the same reference numerals as in FIG. 7 denote the same parts, and a detailed description thereof will be omitted.

In this example, one electrode (gate electrode) of each of capacitance elements 44A-1, ..., 44-n is connected to the gate of the MOSFET 33. A control circuit 45C selectively applies an "H"- or "L"-level potential to the other electrode (layer which forms a counter electrode with respect to the gate electrode) of each of the capacitance elements 44A-1, ..., 44A-n.

The capacitances of the capacitance elements 44A-1, ..., 44A-n connected to the gate of the MOSFET 33 can be selected, freely controlling the signal delay amount.

In Example 8, similar to Example 3, the capacitance ratio of the n capacitance elements is set to $1:2:4: \ldots :2^n$ so as to change the delay amount at a $2^n$-power step. By selecting the capacitance elements 44A-1, ..., 44A-n, the delay amount can be set at a fine step within a wide range of a large capacity to a small capacity, and can be more accurately controlled.

The signal delay time by the line length difference between a pair of differential lines can be more accurately compensated for, and a skew and common mode noise can be further reduced.

In the second embodiment and Examples 5 to 8, the delay element 44 is inserted in one of the signal lines SC and SD which transmit a pair of differential signals from the circuit 37 to the differential output driver circuit 31 so as to adjust the delays of signals passing through the signal lines SA and SB to be substantially equal to each other. It is also possible to arrange the delay elements 44 on both the signal lines SC and SD and adjust signal delay times generated by the line length difference between a pair of differential lines SA and SB so as to be substantially equal to each other.

A plurality of delay elements having different structures may be combined and inserted in at least one of the signal lines SA and SB which transmit a pair of differential signals to the gates of the differential input MOSFETs 32 and 33.

EXAMPLE 9

Figure 13:
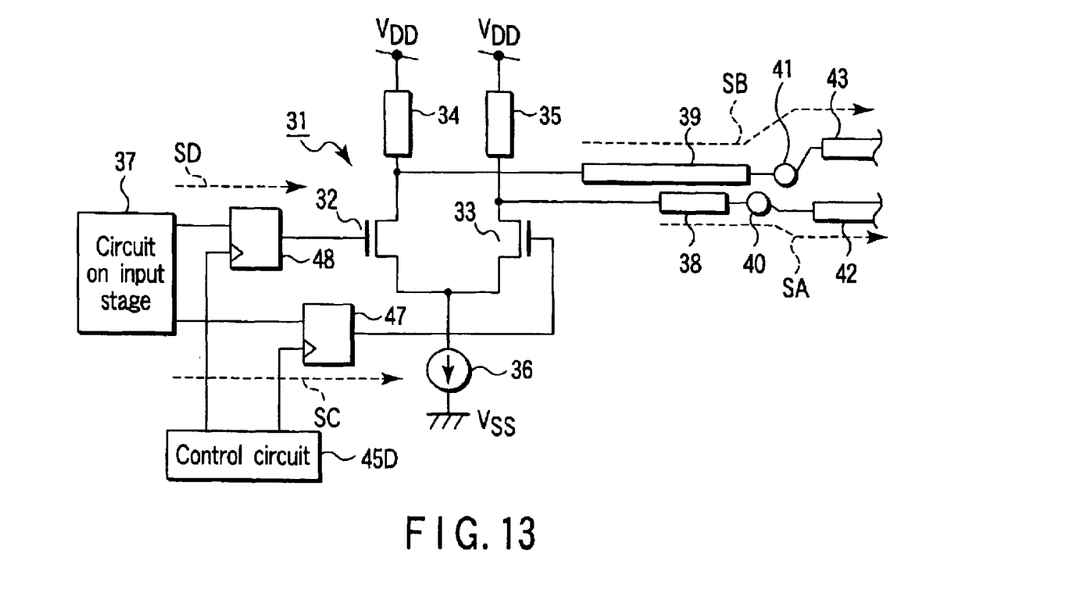
FIG. 13 is a circuit diagram showing still another concrete implementation example (Example 9) of the delay element in the semiconductor integrated circuit device according to the second embodiment of the present invention.

FIG. 13 shows still another concrete implementation example of the delay element 44 in the semiconductor integrated circuit device according to the third embodiment. In FIG. 13, the same reference numerals as in FIG. 7 denote the same parts, and a detailed description thereof will be omitted.

In Example 9, flip-flop circuits 47 and 48 are inserted in the signal lines SC and SD which transmit a pair of differential signals from the circuit 37 to the differential output driver circuit 31. A control circuit 45D supplies clock signals in different phases to the flip-flop circuits 47 and 48.

The control circuit 45D supplies clock signals in different phases to the flip-flop circuits 47 and 48 to control them. A pair of differential signals can be synchronized at different timings, and the delay amount between a pair of differential signals can be so controlled as to adjust the delays of signals passing through the signal lines SA and SB to be substantially equal to each other.

Note the clock signals supplied to the flip-flop circuits 47 and 48 can be use of in-phase signals.

According to the arrangement of Example 9, the delay amount can be freely controlled without degrading the rise/fall times of a pair of differential signals. The signal delay time by the line length difference between a pair of differential lines (signal lines SA and SB) can be accurately compensated for without degrading the rise/fall times of a pair of differential signals, and a skew and common mode noise can be further reduced.

Third Embodiment

Figure 14:
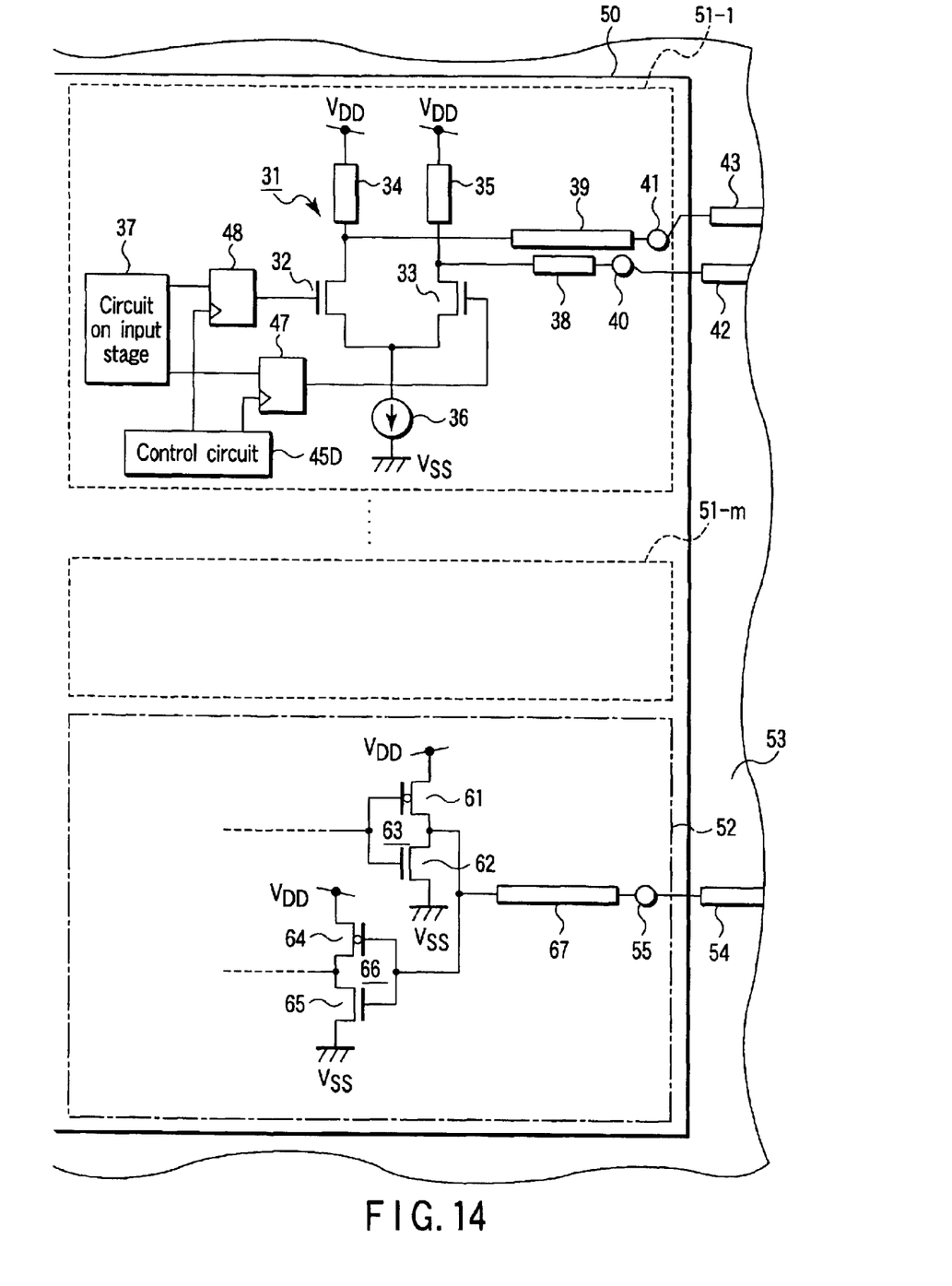
FIG. 14 is a circuit diagram for explaining a semiconductor integrated circuit device according to the third embodiment of the present invention.

FIG. 14 is a circuit diagram for explaining a semiconductor integrated circuit device according to the third embodiment of the present invention. A plurality of (m) differential output driver circuits 51-1, . . . , 51-m described in Example 9, and an I/O circuit 52 having no terminal resistor on the receiving side are formed on a semiconductor chip 50.

The chip 50 is mounted on a printed circuit board 53. Transmission lines 42 and 43 on the printed circuit board 53 are connected to the differential output driver circuit 51-1 via bumps 40 and 41. A transmission line 54 on the printed circuit board 53 is connected to the I/O circuit 52 via a bump 55.

The I/O circuit 52 comprises a CMOS inverter 63 formed from a P-channel MOSFET 61 and N-channel MOSFET 62, and a CMOS inverter 66 formed from a P-channel MOSFET 64 and N-channel MOSFET 65. The CMOS inverter 63 is used as an output, its input terminal is connected to an internal circuit, and its output terminal is connected to one end of a global interconnection 67. The CMOS inverter 66 is used as an input, its input terminal is connected to one end of the global interconnection 67, and its output terminal is connected to the internal circuit. The other end of the global interconnection 67 is connected to the bump 55, and the bump 55 is connected to the transmission line 54 on the printed circuit board 53.

That is, in the third embodiment, the I/O circuit 52 having no terminal resistor on the receiving side is integrated in one chip 50 having many differential output driver circuits.

The I/O circuit 52 having no terminal resistor on the receiving side is generally used for a low-speed signal. When the transmission line 54 used by the I/O circuit 52 is formed on the same printed circuit board 53 as the transmission lines 42 and 43 used by the differential output driver circuits 51-1, . . . , 51-m, the transmission line 54 having no termination is readily coupled to common mode noise, and the common mode noise component is radiated from the transmission line 54.

Even in the presence of both the high-speed I/O circuit and low-speed I/O circuit, the radiation level of electromagnetic waves from the transmission line connected to the low-speed I/O circuit can be reduced by reducing a skew and common mode noise in the differential output driver circuits 51-1, . . . , 51-m.

The control circuits 45D in the differential output driver circuits 51-1, . . . , 51-m are controlled to control the delay time between the m driver circuits 51-1, . . . , 51-m and the I/O circuit 52 in consideration of a skew and common mode noise. This enables adjustment considering the entire chip.

FIG. 14 illustrates the differential output driver circuits 51-1, . . . , 51-m having the arrangement shown in FIG. 13. The circuit in any one of the embodiments or examples can be similarly applied. A TTL interface has been described as an example of an I/O circuit having no terminal resistor on the receiving side, but an I/O circuit of another type can be adopted.

Fourth Embodiment

Figure 15:
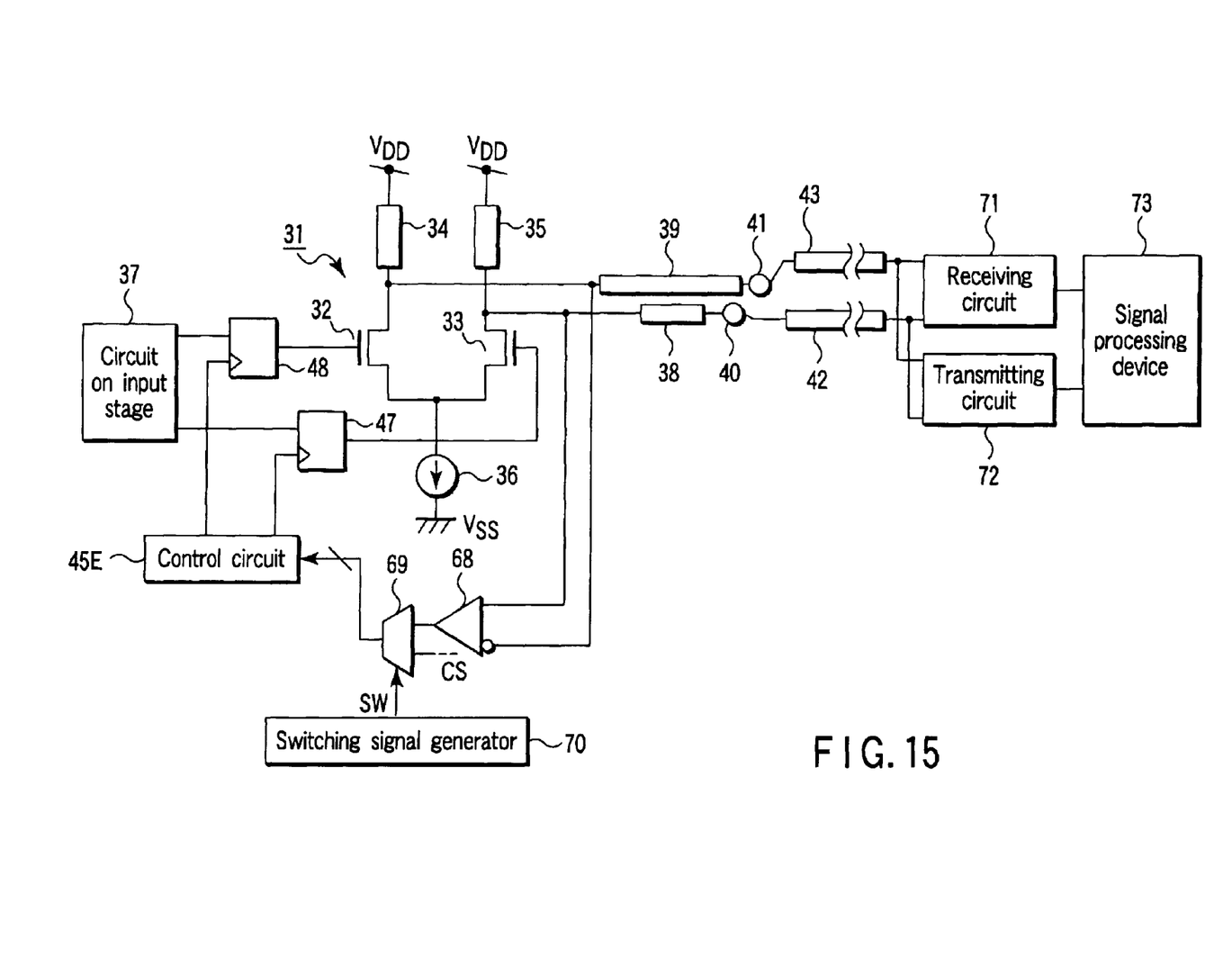
FIG. 15 is a circuit diagram for explaining a semiconductor integrated circuit device and a system using the semiconductor integrated circuit device according to the fourth embodiment of the present invention.

FIG. 15 shows an output circuit (differential output driver circuit) which transmits a pair of differential signals and its peripheral circuit, in order to explain a system using a semiconductor integrated circuit device according to the fourth embodiment of the present invention.

In the fourth embodiment, a receiving circuit 68, signal selecting circuit 69, and switching signal generator 70 are formed within a chip (semiconductor integrated circuit device). The receiving circuit 68 receives correction data having passed through global interconnections 38 and 39 outside the chip, and supplies the data to the signal selecting circuit 69. The receiving circuit 68 incorporates a signal processing circuit which generates a control signal. The signal selecting circuit 69 is controlled by a switching signal SW output from the switching signal generator 70. The signal selecting circuit 69 switches between a control signal output from the receiving circuit 68 and a control signal CS supplied from the internal circuit or outside the chip, and supplies the selected signal to a control circuit 45E.

A receiving circuit 71, transmitting circuit 72, and signal processing device 73 are arranged outside the chip. The receiving circuit 71 receives a pair of differential signals output from the semiconductor integrated circuit device via signal lines SA and SB. The signal processing device 73 processes the pair of differential signals received by the receiving circuit 71, and generates correction data for correcting unbalance between the pair of differential signals. The transmitting circuit 72 transmits the correction data generated by the signal processing apparatus 73 to the semiconductor integrated circuit device. The transmitting circuit 72 is mounted on the same chip as that of the receiving circuit 71.

In this arrangement, the receiving circuit 71 monitors a pair of differential signals output from the semiconductor integrated circuit device, and the signal processing device 73 obtains a delay amount so as to attain an optimal reception signal waveform. Correction data as a processing result obtained by the signal processing device 73 is supplied from the transmitting circuit 72 to the receiving circuit 68 via transmission lines 42 and 43, pads 40 and 41, and global interconnections 38 and 39. The signal processing circuit in the receiving circuit 68 generates a control signal for controlling the control circuit 45E. Under the control of the switching signal generator 70, the signal selecting circuit 69 supplies a control signal generated by the signal processing circuit or the control signal CS to the control circuit 45E. Flip-flop circuits 47 and 48 are controlled, and a pair of differential signals supplied from a circuit 37 on the input stage to the gates of differential input MOSFETs 32 and 33 are synchronized with each other.

The system having this arrangement monitors a pair of differential signals output from the semiconductor integrated circuit device, determines a delay amount, and can optimize the delay amount. In addition, the waveforms of a pair of differential signals output from the semiconductor integrated circuit device can be optimized. A skew and common mode noise generated by the line length difference between a pair of differential lines connected to the semiconductor integrated circuit device can be more effectively reduced.

The fourth embodiment has exemplified an arrangement using the flip-flop circuits 47 and 48 shown in FIG. 13. The structure in any one of the embodiments or examples can be similarly applied.

Correction data output from the transmitting circuit 72 is supplied to the receiving circuit 68 by using the signal lines SA and SB for externally outputting a pair of differential signals. Correction data may be input to the receiving circuit 68 via another path.

Fifth Embodiment

Figure 16:
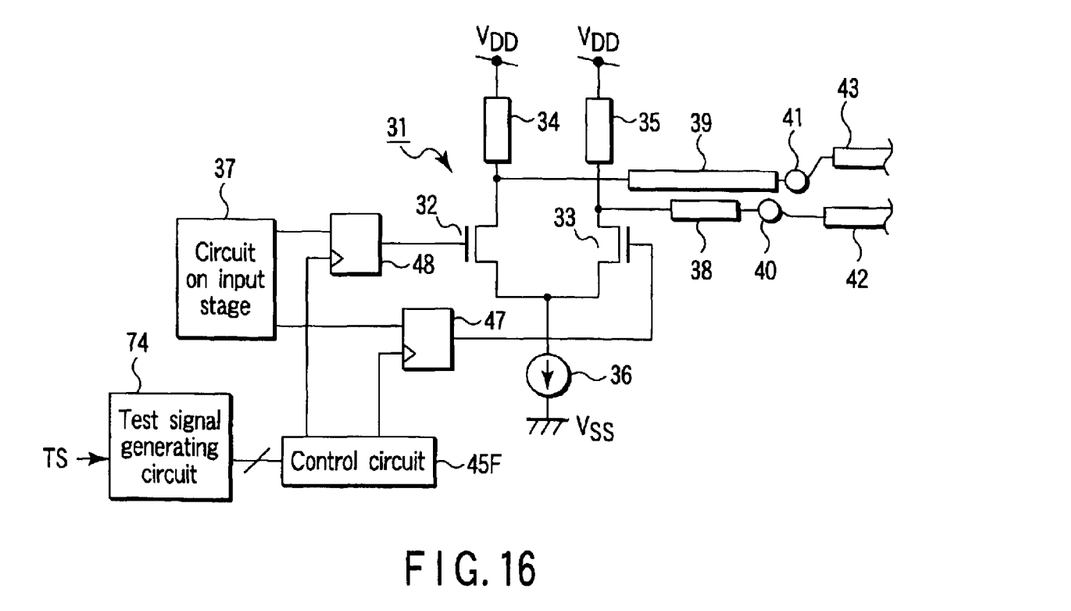
FIG. 16 is a circuit diagram for explaining a semiconductor integrated circuit device and a system using the semiconductor integrated circuit device according to the fifth embodiment of the present invention.

FIG. 16 shows an output circuit (differential output driver circuit) which transmits a pair of differential signals and its peripheral circuit, in order to explain a semiconductor integrated circuit device and a system using the semiconductor integrated circuit device according to the fifth embodiment of the present invention. In the fifth embodiment, a test signal generating circuit 74 is arranged on a chip, and a control circuit 45F is controlled by a signal output from the test signal generating circuit 74.

The test signal generating circuit 74 changes the phase of a clock signal output from the control circuit. 45F, and controls the delay amounts of a pair of differential signals by flip-flop circuits 47 and 48. An IC tester is connected to transmission lines 42 and 43 to determine the difference between a pair of differential signals and check a margin for the delay amount. At this time, a test signal TS is supplied from the IC tester to the test signal generating circuit 74, controlling the operation.

Since the test signal generating circuit 74 is incorporated in the chip, a margin for a skew or common mode noise generated by unbalance between a pair of differential signals can be tested.

The fifth embodiment has exemplified an arrangement using the flip-flop circuits 47 and 48 shown in FIG. 13. The test signal generating circuit 74 may be similarly arranged in the structure in any one of the embodiments or examples.

Sixth Embodiment

Figure 17:
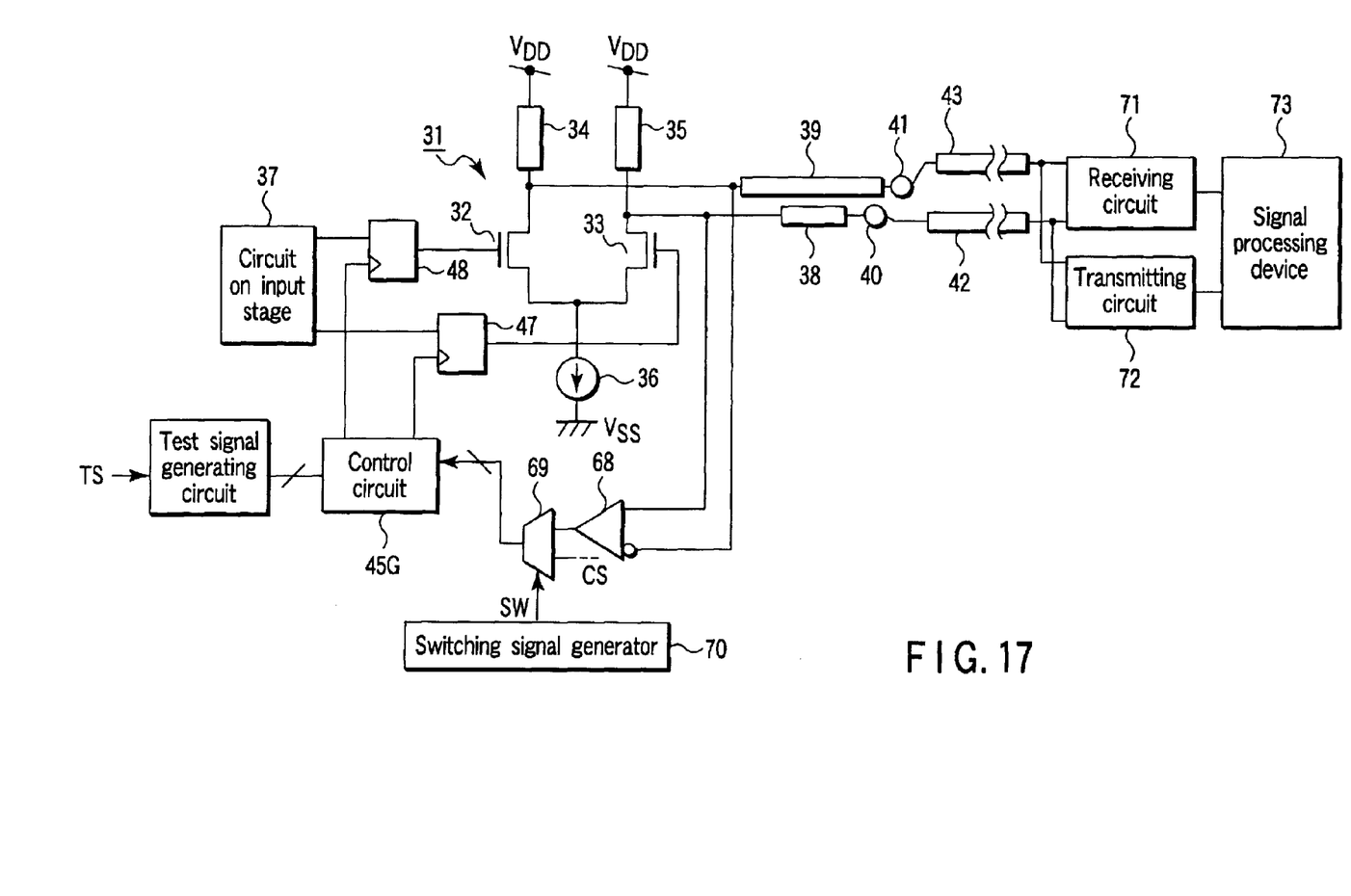
FIG. 17 is a circuit diagram for explaining a semiconductor integrated circuit device and a system using the semiconductor integrated circuit device according to the sixth embodiment of the present invention.

FIG. 17 shows an output circuit (differential output driver circuit) which transmits a pair of differential signals and its peripheral circuit, in order to explain a semiconductor integrated circuit device and a system using the semiconductor integrated circuit device according to the sixth embodiment of the present invention. The sixth embodiment adopts a combination of the arrangement according to the fourth embodiment and the arrangement according to the fifth embodiment.

The circuit shown in FIG. 17 has the functions of both the control circuit 45E shown in FIG. 15 and the control circuit 45F shown in FIG. 16. The remaining arrangement is the same as those of the circuits shown in FIGS. 15 and 16. The same reference numerals denote the same parts, and a detailed description thereof will be omitted.

In this arrangement, a pair of differential signals output from the semiconductor integrated circuit device upon reception of a test signal are monitored by a receiving circuit 71. Flip-flop circuits 47 and 48 are controlled in accordance with the monitoring result, and the pair of differential signals can be synchronized at different timings. Hence, the effects of both the circuits shown in FIGS. 15 and 16 can be obtained.

As has been described above, the semiconductor integrated circuit device according to the first to sixth embodiments of the present invention can suppress a skew and common mode noise generated by the line length difference between a pair of differential lines.

The system using the semiconductor integrated circuit device according to the fourth to sixth embodiments of the present invention can optimize the waveforms of a pair of differential signals.

The system using the semiconductor integrated circuit device according to the fifth and sixth embodiments of the present invention can check a margin for a skew or common mode noise generated by unbalance between a pair of differential signals owing to manufacturing variations.

As described above, according to one aspect of this invention, there is provided a semiconductor integrated circuit device capable of suppressing a skew and common mode noise generated by the line length difference between a pair of differential lines.

Also, there is provided a system using a semiconductor integrated circuit device that can check a margin for a skew or common mode noise generated by manufacturing variations.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor integrated circuit device comprising;
a chip on which an integrated circuit is formed;
a differential output driver circuit which externally outputs a pair of differential signals generated by the integrated circuit;

first and second signal lines which transmit the pair of differential signals output from the differential output driver circuit; and a delay unit which is connected in the chip to at least one of the first and second signal lines, has an active element for delaying signals passing through the first and second signal lines so as to make delays of the signals substantially equal to each other, and compensates for a signal delay time generated by a line length difference between the first and second signal lines.

2. The device according to claim 1, wherein the delay unit includes a capacitance element having one electrode connected to a signal line with a shorter line length out of the first and second signal lines, and the capacitance element includes a capacitance element using a MOS (Metal-Oxide-Semiconductor) gate capacitance.

3. The device according to claim 1, wherein the delay unit can change a delay time.

4. The device according to claim 3, wherein the delay unit comprises a plurality of capacitance elements, and a control circuit which is interposed between a signal line with a shorter line length out of the first and second signal lines and one electrode of each of said plurality of capacitance elements and selectively applies a potential to said one electrode of each of said plurality of capacitance elements.

5. The device according to claim 3, wherein the delay unit comprises a plurality of capacitance elements, a plurality of switching elements each of which is connected between one electrode of a corresponding one of said plurality of capacitance elements and a signal line with a shorter line length out of the first and second signal lines, and a control circuit which selectively ON/OFF-controls said plurality of switching elements.

6. The device according to claim 3, wherein the delay unit comprises a plurality of capacitance elements each having one electrode connected to a signal line with a shorter line length out of the first and second signal lines, and a control circuit which selectively applies a potential to the other electrode of each of said plurality of capacitance elements.

* * * * *